United States Patent
Letas et al.

(10) Patent No.: US 8,749,082 B2
(45) Date of Patent: Jun. 10, 2014

(54) MONITORING DEVICE FOR PITCH SYSTEMS OF WIND ENERGY SYSTEMS

(75) Inventors: Heinz-Hermann Letas, Suesel (DE); Matthias Peters, Eesch (DE)

(73) Assignee: Senvion SE, Hamburg (DE)

( * ) Notice: Subject to any disclaimer, the term of this patent is extended or adjusted under 35 U.S.C. 154(b) by 667 days.

(21) Appl. No.: 12/993,405

(22) PCT Filed: May 29, 2009

(86) PCT No.: PCT/EP2009/003842
§ 371 (c)(1),
(2), (4) Date: Mar. 10, 2011

(87) PCT Pub. No.: WO2009/146848
PCT Pub. Date: Dec. 10, 2009

(65) Prior Publication Data
US 2011/0181045 A1 Jul. 28, 2011

(30) Foreign Application Priority Data
May 30, 2008 (DE) .......................... 10 2008 025 944

(51) Int. Cl.
*F03D 9/00* (2006.01)
(52) U.S. Cl.
USPC .............................................. 290/44; 322/37
(58) Field of Classification Search
USPC .............................. 290/43, 44, 54, 55; 322/37
See application file for complete search history.

(56) References Cited

U.S. PATENT DOCUMENTS

| 3,529,230 | A | | 9/1970 | Tedd | |
|---|---|---|---|---|---|
| 5,907,192 | A | * | 5/1999 | Lyons et al. | 290/44 |
| 7,256,508 | B2 | * | 8/2007 | Altemark et al. | 290/44 |
| 7,256,509 | B2 | * | 8/2007 | Brandt et al. | 290/44 |
| 7,436,086 | B2 | * | 10/2008 | McClintic | 290/55 |
| 8,084,875 | B2 | * | 12/2011 | Letas | 290/44 |
| 8,106,525 | B2 | * | 1/2012 | Letas | 290/44 |
| 8,303,251 | B2 | * | 11/2012 | Loh et al. | 416/48 |
| 8,344,532 | B2 | * | 1/2013 | Letas | 290/44 |
| 2006/0273783 | A1 | | 12/2006 | Keuss | |
| 2007/0024227 | A1 | | 2/2007 | Kunkel et al. | |
| 2008/0129234 | A1 | | 6/2008 | Buente et al. | |
| 2010/0295304 | A1 | * | 11/2010 | Rowan et al. | 290/44 |

FOREIGN PATENT DOCUMENTS

| DE | 2 043 660 | 3/1972 |
|---|---|---|
| DE | 102 61 491 | 7/2004 |
| DE | 10 2005 030 | 1/2007 |
| DE | 20 2006 018 866 | 3/2007 |
| DE | 10 2006 049 | 4/2008 |
| EP | 1 739 807 | 1/2007 |
| GB | 1175119 | 12/1969 |

OTHER PUBLICATIONS

International Search Report mailed Sep. 3, 2010 directed towards international application No. PCT/EP2009/003842; 4 pages.

* cited by examiner

*Primary Examiner* — Nicholas Ponomarenko
(74) *Attorney, Agent, or Firm* — Morrison & Foerster LLP (57) ABSTRACT

A wind energy installation, monitoring device, and method. An exemplary wind energy installation includes a rotor including at least one blade and a generator configured to be driven by the rotor to produce electrical energy. The installation also includes a pitch device configured to vary the at least one blade of the rotor. The pitch device includes a power supply unit with a battery, an actuating drive, a monitoring unit, and a load module configured to switch the actuating drive between an operating mode and a test mode. In the test mode, the actuating drive forms a preselectable defined load for the battery. Accordingly, a high and reproducible load not dependent upon environmental conditions may be applied to conduct a stress test, even during ongoing operation.

18 Claims, 3 Drawing Sheets

MONITORING DEVICE FOR PITCH SYSTEMS OF WIND ENERGY SYSTEMS

REFERENCE TO RELATED APPLICATIONS

This application is a national stage application under 35 USC 371 of International Application No. PCT/EP2009/003842, filed May 29, 2009, which claims the priority of German Patent Application No. 10 2008 025 944.6, filed May 30, 2008, the contents of which prior applications are incorporated herein by reference.

FIELD OF THE INVENTION

The invention relates to a monitoring device for pitch systems for wind energy installations. To be more precise, the invention relates to wind energy installations having a rotor, a generator which is driven by the rotor in order to produce electrical energy, wherein the rotor has at least one blade which can be varied by means of a pitch device, wherein the pitch device has a power supply by means of a battery and has an actuating drive, and wherein a monitoring unit is provided for the battery for the pitch device.

BACKGROUND OF THE INVENTION

Wind energy installations of the type mentioned initially have variable-pitch rotor blades whose pitch angle with respect to the incident wind can be varied. Pitch systems such as these allow two different functionalities, specifically on the one hand variable rotation-speed operation, and on the other hand allow the wind energy installation to be shut down. The latter is done by moving the rotor blades to a feathered position in which they are no longer caused to rotate by the wind. The latter function is actually particularly important since it acts as a braking function. This is a particularly safety-critical aspect for the wind energy installation. In order to make it possible to ensure that the wind energy installation can be shut down via the pitch control, even if the electrical power supply to the wind energy installation fails, dedicated rechargeable-battery systems are generally provided for the pitch device. These ensure that electrical power is supplied to the pitch device even in the event of power supply system failure. Conventional rechargeable batteries or else capacitors with a particularly high capacitance (for example ultra caps) are used as energy stores. Absolutely independently of the precise design used for the rechargeable batteries, they are nevertheless subject to the same disadvantage that these are parts which are subject to wear. In order to safely prevent the failure of the pitch device because of a possibly defective rechargeable battery, because of the safety-critical functionality, the rechargeable batteries are checked at regular time intervals. Various methods have become known in the prior art for this purpose.

DE 10 2005 030 709 discloses the life of the rechargeable batteries being lengthened by optimizing the load and charging processes, by using current-limiting measures, monitoring the temperature of the rechargeable batteries, and measuring the terminal voltage of the individual rechargeable batteries.

SUMMARY OF THE INVENTION

The invention is based on the object of specifying an improved monitoring device and method which are less susceptible to faults, on the basis of said methods.

The solution according to the invention resides in the features broadly disclosed herein. Advantageous developments are the subject matter of the disclosure.

In a wind energy installation having a rotor, a generator which is driven by the rotor for production of electrical energy, wherein the rotor has at least one blade which can be varied by means of a pitch device, and the pitch device has a power supply unit with a battery and an actuating drive and, furthermore, a monitoring unit, the invention provides a load module, which switches the actuating drive between an operating mode and a test mode, wherein, in the test mode, the actuating drive forms a preselectable defined load for the battery. This allows a load to be applied to the battery, and its response to be tested when subject to this load (stress test).

A battery means an electrical energy store. In particular, this may be a rechargeable battery or a high-capacitance capacitor (ultra-cap).

The invention is based on the idea of using the actuating drive to create constraints which are defined in the test mode, and in which the quality of the power supply unit for the pitch device can be tested. When a known, well-defined load (fixed load) is connected, reproducible conditions can be created for the test. This makes it possible to also compare measurements taken at successive times with one another. Changes to the batteries over time can be identified, and can be taken into account when deciding that they are ready for replacement. Furthermore, the reproducible measurements offer the advantage that more precise limit values can be set. This not only improves the quality of the measurement, but also makes it possible to dispense with safety margins as buffers for environmental fluctuations which cannot be influenced, thus allowing the batteries to be used until they actually need to be replaced. There is therefore no longer any need for the rather premature replacement which is normally required for safety reasons, reducing the costs incurred. At the same time, the reproducible conditions prevent batteries which need to be replaced from still being incorrectly classified as being serviceable on the basis of test conditions which are better for them. In the past, an incorrect classification such as this has involved a considerable safety risk for the fail-safety of the wind energy installation, which the invention avoids. The invention therefore combines advantages relating to better operating costs with enhanced safety.

The actuating drive preferably has a switchable resistance at its input, and the resistance acts as a fixed load in the test mode. The provision of a resistance such as this involves negligible complexity. A resistance such as this at the input therefore allows a fixed load to be produced in a particularly simple and advantageous manner.

It is preferable for the actuating drive to have a converter and a direct current motor, with the load module being designed to apply a predeterminable current to the direct current motor, in accordance with a defined load. In this case, the invention makes use of the fact that in modern wind energy installations, the actuating drive for the pitch devices generally has a converter and a motor, generally a direct current motor, in any case. No additional complexity is therefore incurred for this. Since the converter is connected to the motor it is supplied from, such that it acts as a fixed load, a fixed and desired high load can be applied without any additional hardware complexity. The converter allows the battery to be tested at a high current level as well. This allows not only a rapid test to be carried out, but also a stress test, which is very important for the serviceability of the battery. A further advantage of using the converter is that the load to be applied to the battery is not limited by the resistance and the power with which it can be loaded. In order to make it possible to apply an even greater load if desired, a brake is expediently operated on the actuating drive, against which the actuating drive acts. This makes it possible to carry out the battery test independently of the position of the rotor blades. There is therefore no need to move the rotor blade to a limit position in which, for example, it is resting on a stop. The load test can therefore be used more universally. In particular, the test can also be carried out while the wind energy installation is in operation, to be precise while it is being operated on a partial load. In order to further increase the load on the battery, it is also possible to additionally pass current through the resistance at the input to the actuating drive. In order to prevent overloading when large test currents are being used, temperature monitoring is preferably provided for the converter and/or the resistance.

According to one preferred development of the invention, a discharge control module is provided, which is designed to reduce the voltage acting on the actuating drive to a predeterminable voltage level at the test start. In general, this is the battery voltage level to which the intermediate circuit is discharged. However, the battery can also be discharged to a greater extent. This is worthwhile when, in order to ensure adequate safety, the power supply unit is designed such that the variable pitch of the rotor blade can be effected not only with an ideal, fully charged battery, but also when the battery is only partially charged.

Furthermore, the load module preferably interacts with an isolating contactor, which disconnects the battery from a power supply system. The isolating contactor means that the charging of the battery via the power supply system is prevented during the test, thus preventing the risk of the test result being corrupted by the power supply system.

Furthermore, a monitoring module is preferably provided, which monitors the state, in particular the temperature of the resistance, the position of the rotor blade (and/or the function of the brake) and/or of the direct current motor, and if necessary terminates the test. This absolves the risk of the components used for testing being overloaded, in particular when testing at high current levels. Damage occurring in this case would not only have the disadvantage that it would lead to component failure, but would even lead to the wind energy installation being shutdown (which involves considerable costs), because these are safety-critical components.

A load identification module is advantageously provided, which determines the load state of the wind energy installation and inhibits the load control module if a threshold is exceeded. In this case, inhibiting means that the load control module if a threshold is exceeded. In this case, inhibiting means that the load control module is changed to a state in which it does not carry out any battery tests. It has been found that although, in principle, the invention allows the wind energy installation to be tested during operation, this should not be done, however, when on full load or on a high partial load since the pitch must be varied by the pitch motor in these ranges. The additional loads applied by the battery test can lead, if the wind is relatively strong, to the pitch device being unloaded with excessively high pitch-variation forces. In order to preclude the risk of damage or failure, the load identification module identifies that a situation with a high load has occurred, and in this case prevents the battery test from being carried out, or interrupts it, if a high load is identified during the battery test, for example on the basis of the rotation speed, the power and/or the wind speed.

The load identification module expediently interacts with a timer which carries out a test at predeterminable intervals, and monitors timings during testing. This allows the wind energy installation to be monitored largely automatically, when being operated autonomously.

The load control module according to the invention can preferably also be designed to monitor the rotor blade for a pitch change when the brake is operated. If the rotor blade moves despite the brake being operated when carrying out the load test, then this means a brake fault, and an appropriate signal is output to the operating control system of the wind energy installation. This can also be done deliberately. For example, a brake test unit can additionally be provided in order to test the state of the brake and passes current through the actuating drive, with a specific test moment. The test moment is chosen such that it is less than the holding moment which can be applied by the brake. If the brake nevertheless slips, then the brake is faulty, and a fault signal is output.

Preferably, a monitor module is also provided, which tests the serviceability of the battery monitor. This allows a self-check to be implemented. In particular, this avoids the dangerous situation in which batteries which are no longer serviceable are still incorrectly classified as "good" because the load control module is not operating correctly. For this purpose, the monitor module expediently has a detector which monitors the battery voltage for a dip at the test start, and outputs a fault signal in the absence of this. Because of the high load at the start of the test, a voltage dip occurs even with good batteries. If there is no such dip, this means that either the voltage monitoring is not operating correctly, or that the battery is still being supplied via the power supply system. In both cases, the test is impossible, and a fault signal is correspondingly output.

A first monitoring method consists of checking the voltage of the rechargeable battery on load. For this purpose, the pitch device is operated, with current being taken from the rechargeable battery, and with the voltage dip that occurs in the process being determined. In a second, more advanced monitoring method, not only is the magnitude of the voltage dip checked, but the time profile is also monitored. A battery monitor is provided for this purpose, and is selected to tolerate the voltage dip for a short time when loaded, and to check the voltage profile to determine whether the voltage recovers within a defined time after the end of the load. If predefined limit values are not complied with in this case, then the rechargeable battery is classified as being no longer serviceable. One disadvantage of these methods is the dependency on external factors. For example the current drawn by the actuating drive may be increased because of heaviness of the gearbox because of a disadvantageous wind load, or because the temperatures are very cold. An increase in the current drawn caused by this leads to a greater and more long-lasting voltage dip, as a result of which rechargeable batteries which are still useable appear to be ready for replacement when subjected to this increased load. In addition, it is also possible for the load to be reduced with a certain wind load to such an extent that only a small voltage dip will occur with rechargeable batteries which are intrinsically worn out, therefore resulting in them still being classified as serviceable.

According to a further advantageous embodiment of the invention, which may be used for independent protection, a test control module is provided. This is designed to apply a selectable test characteristic to the actuating drive. For this purpose, the test control module has a memory with a plurality of test control characteristics, one of which is selected, and is used for testing by means of the load control module. At least three test characteristics are preferably contained as profiles in the memory. A first profile, which forms a load with a fixed resistance, a second profile, which forms a load with a constant current, and a third profile, which forms a load with a constant power. The load with a resistance forms the simplest case, which requires the least hardware complexity. The load with a constant power offers the advantage that it corresponds best to the load during actual operation. The load with a constant current offers the advantage that it produces the results which can be evaluated best, since the voltage changes of the battery when loaded can be used directly as a measure. In this case, the actuating drive is operated such that a constant current is passed through the motor. In this case, the actuating drive, together with its converter, acts like a transformer for direct current, in which case the transformation ratio can be varied by the drive. This is generally done by the test control module controlling the actuating drive with a predeterminable modulation degree. This can be varied correspondingly to the respectively desired load. The intrinsically fixed resistance of the actual motor thus becomes a variable resistance on the battery side. This results in two major advantages with a minimal amount of additional hardware complexity, specifically on the one hand that the load on the battery can be changed and adjusted variably, and on the other hand that it is easily possible to compensate for other changes in the motor resistance, for example in the steady state as a result of scatters between individual motors, or dynamically as a result of a resistance increase because of heating. The test control module is expediently designed such that it detects actual parameters of the motor and has a compensation unit, which compensates for changes in the parameters from a standard value.

Compound motors, which have a series winding and a shunt winding, are preferably used as actuating drives in relatively large wind energy installations. It has been found that operation as a pure series-wound motor is better for the load test. The test control module expediently interacts with an excitation switching module which passes current only through the series winding, and disconnects the shunt winding, during the test.

In order to manage with as little additional load as possible on the components of the actuating drive, a direction selection module is preferably provided. This is designed to determine a load direction on the rotor blade during operation of the wind energy installation, and to act on the test control module such that the actuating drive operates the blade in the opposite direction. This advantageously makes use of the initial load on the blade caused by aerodynamic forces as an additional load, such that this relieves the load on the actuating drive and on the brake.

A recording unit is preferably provided, that is designed to record data and status signals for carrying out the test, as well as results. It is advantageously connected to the operating control system of the wind energy installation, and/or to a control system for the pitch device. An assessment can be carried out and can be passed on such that, in the event of a fault, an appropriate fault message can be transmitted to a superordinate entity (park master, power supply system company, or maintenance concern). This can react to the defect, and can initiate rectification.

The invention also relates to a monitoring device for a pitch device for wind energy installations having a battery and an actuating drive, wherein the monitoring device comprises a battery monitor, wherein a load control module is provided, according to the invention, which switches the actuating drive between an operating mode and a test mode, wherein, in the test mode, the actuating drive forms a preselectable defined load for the battery.

Furthermore, the invention relates to a method for monitoring a pitch device for wind energy installations, wherein the pitch device has a battery and an actuating drive, and a battery voltage is monitored in the load case during testing, and, according to the invention, the actuating drive switches between an operating mode and a test mode, wherein, in the test mode, the actuating drive is used under a defined load for the battery.

Reference is made to the above statements, for a more detailed explanation.

BRIEF DESCRIPTION OF THE DRAWINGS

The invention will be explained in the following text with reference to the attached drawings, which illustrate an advantageous exemplary embodiment of the invention, and in which.

DETAILED DESCRIPTION OF THE INVENTION

Figure 1:
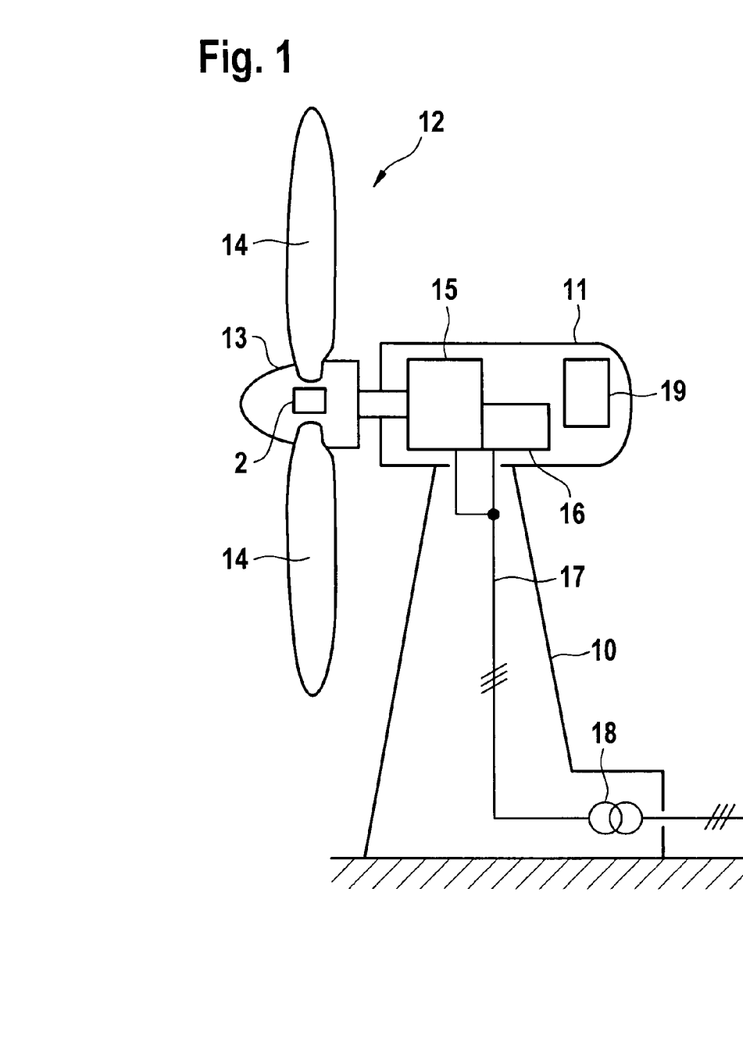
FIG. 1 shows a wind energy installation according to one exemplary embodiment of the invention, in the form of a schematic overview.

According to one exemplary embodiment of the invention, a wind energy installation has a pod 11, which can be pivoted in the azimuth direction on a tower 10 and on whose end face a wind rotor 12 is arranged such that it can rotate. The wind rotor 12 has a hub 13 and one or more rotor blades 14. It drives a generator 15 via a rotor shaft (which is not illustrated). This generator converts the mechanical power produced from the wind by the wind rotor 12 to electrical power. The generator 15 is a doubly-fed asynchronous machine (however, it is also possible to provide other types of generator). This generator 15 is connected to a converter 16. A line 17 is connected to the generator 15 and to the converter 16, and transports the electrical power that has been produced through the tower 10 to a medium-voltage transformer 18, which is arranged at the foot of the tower 10, for passing on into a power supply system (not illustrated). An operating control system 19 is also arranged in the pod 11, and monitors the operation of the entire wind energy installation.

Figure 2:
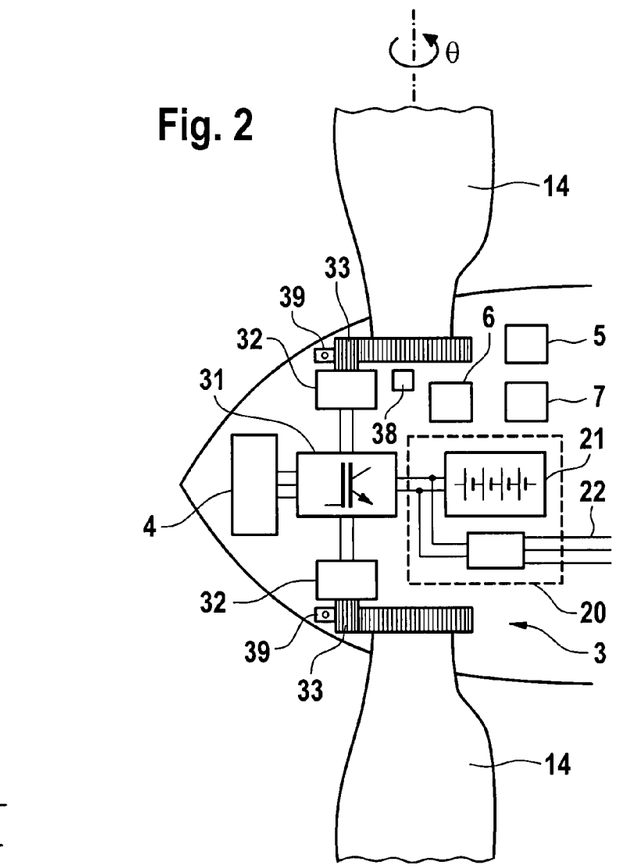
FIG. 2 shows an enlarged illustration of the hub with a pitch device for the wind energy installation as illustrated in FIG. 1.

In order to vary the pitch angle of the rotor blades 14, a pitch device, which is annotated in its totality with the reference number 2, is provided in the hub 13 and comprises power supply unit 20, which has a battery 21 and a connection to a power supply system 22 within the installation. This supplies at least one actuating drive 3, which essentially comprises an intermediate circuit 34, a resistance 30, a converter 31 and a direct current motor 32 as an actuator. Via a set of gearwheels in the form of a spur gearbox 33, the latter causes the rotor blades to rotate about their longitudinal axis, in order in this way to vary the pitch angle θ. This and the rate variation n are detected by a sensor 38 on the toothed rim. The gearwheel set 22 is designed such that it is self-locking. This means that the rotor blade 14 cannot rotate the direct current motor 32 via the spur-gear gearbox 33 (or can do so only slightly) under the influence of aerodynamic loads. It should be noted that other types of gearbox can also be provided, for example a worm-drive gearbox in order to increase the self-locking. In order to position the rotor blades 14 securely with respect to their pitch angle θ in all operating states, a brake 39 is also provided. This may be of the disk brake type, or may be an electromagnetic brake, in a manner known per se.

A monitoring unit 4 is provided in order to control the pitch device 2, is connected to the other components of the pitch device via signaling lines (which are not illustrated), and itself receives its reference signals via signaling lines (which are likewise not illustrated) from the operating control system 19 and transmits state signals and fault messages thereto in the opposite direction.

Figure 3:
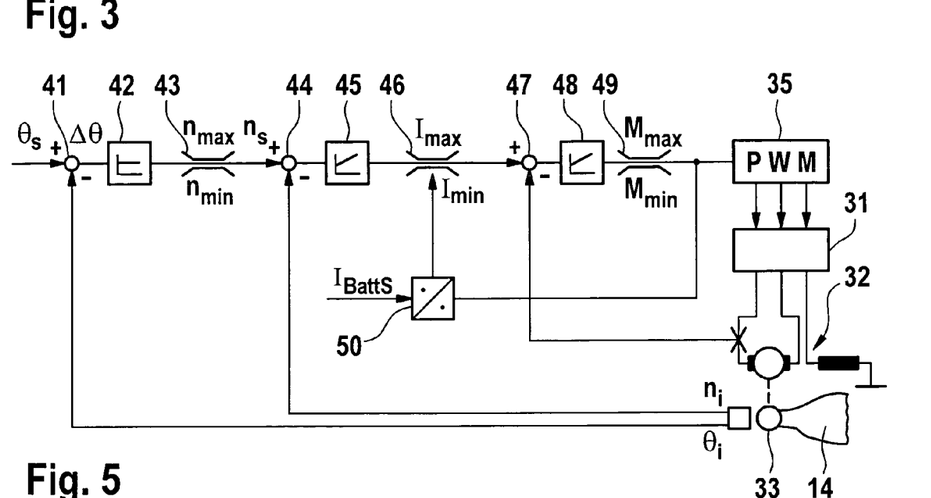
FIG. 3 shows a functional diagram for closed-loop control of an actuating drive for the pitch device.

The method of operation for the variation of the pitch angle will be explained with reference to FIG. 3. A nominal value for the pitch angle θ is applied to a nominal value input for closed-loop control of the pitch angle. To be more precise, it is applied to the positive input of an adder 41. A measured value, determined by the sensor 38, for the actual pitch angle is applied to the negative input of the adder 41. A difference is formed therefrom, and is applied to an orientation, angle or position regulator 42. This uses this difference to determine a variation rate n, which is limited by means of a limit-value element 43. The value for the speed, as determined once again by the sensor 38, is subtracted from this nominal speed at the addition point 44, and the difference which results from this is applied to a rotation-speed regulator 45, which uses this to determine a current measure for the torque required from the motor 32. The current measure is connected to a limiter 46. The current measure limited in this way is applied as the nominal value to an addition point 47, to whose negative input a measure for the actual motor current is applied. The difference resulting from this is applied to the input of a current regulator 48, which uses this to determine a signal for the length of the switch-on pulses for the active switches for the converter 31. This signal is in turn limited by maximum and minimum limiters, and is then applied to the control input of the pulse-width modulator 35, which controls the switching of the active elements of the converter 31. This structure is subject to the problem that, when the motor 32 has been braked to rest, a change in the nominal value for the angle situation means that the corresponding nominal values for the rotation speed and motor current run into the limits. In order to prevent this, the current regulation of the rotation-speed regulator 42 can additionally be reduced by a feedback signal, to be precise to upper and lower limits for the motor current. This can be done within a pre-control system 50, as is shown in FIG. 3. The pre-control system 50 is designed to produce an appropriate motor current nominal value for a desired battery current. This prevents the regulators 42, 45 and 48 from becoming saturated during the test.

A battery monitor 40 is connected to the monitoring unit 4 and is designed to monitor the state of charge of the battery 21. In principle, the battery 21 can be charged via the installation-internal power supply system 22 during normal operation, as a result of which it can ensure an adequate power supply for the pitch device 2 in the event of a power supply system failure. This is of such a magnitude that the rotor blades 14 can safely be moved to a neutral feathered position in all conditions. It is self-evident that the batteries 21 must have sufficient capacity for this purpose, and that neither as result of a defect nor as a result of wear may so much capacity be lost that the charge stored therein is no longer sufficient to move the rotor blades 14 to the safe feathered position. This is tested for its serviceability at regular intervals by means of the battery monitor 40.

Figure 4:
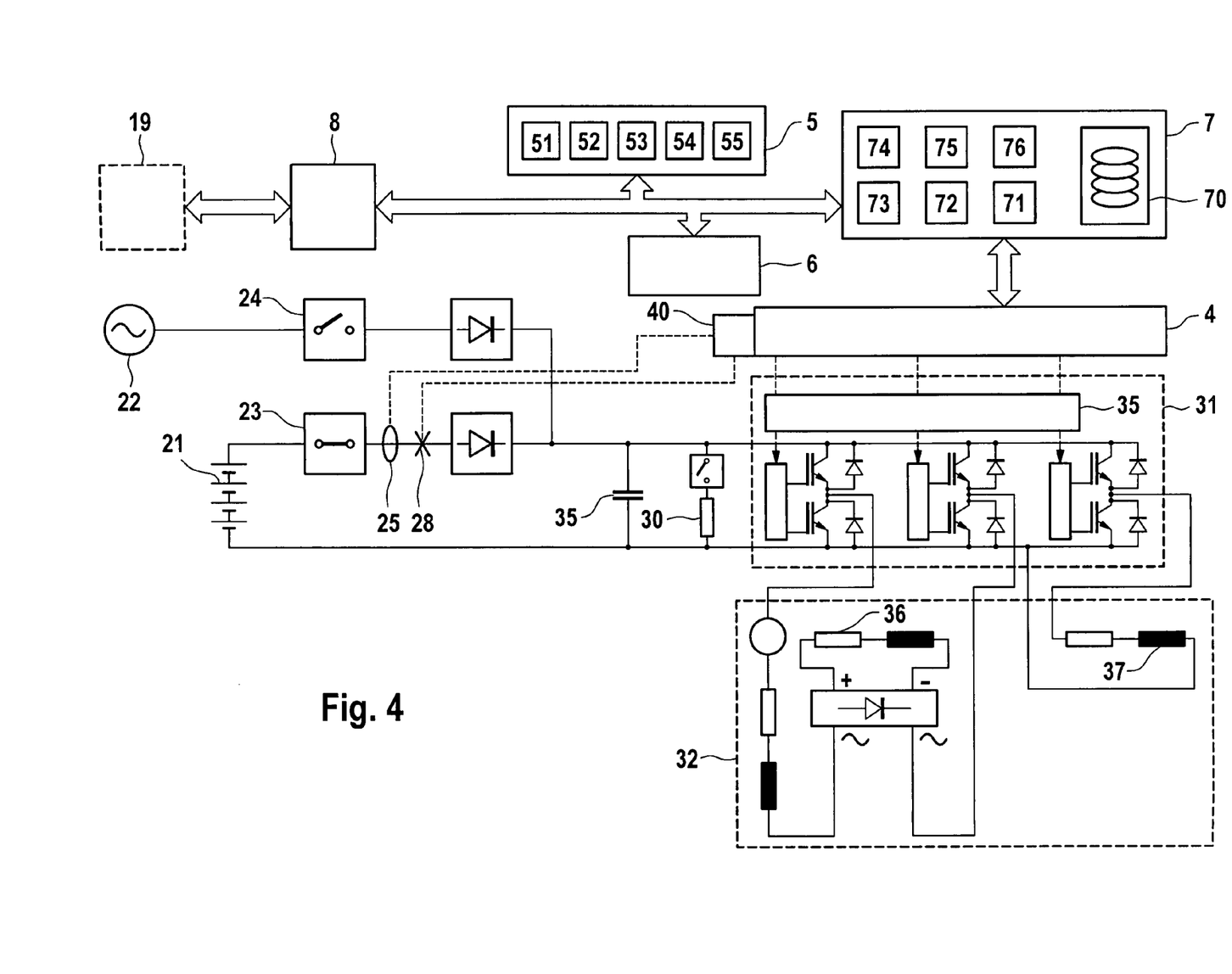
FIG. 4 shows a block diagram of the electrical circuit for the pitch device with a monitoring unit.

First of all, the design of the actuating drive 3, with its interaction with the battery 21, as shown in FIG. 4, will be explained in more detail. The converter 31 supplies the direct current motor 32, which is in the form of a compound motor with a series winding 36 and a shunt winding 37. The converter 31 is in turn supplied from an intermediate circuit 34 with a smoothing capacitor 35. The intermediate circuit 34 is supplied with electrical power in two different ways. On the one hand, the power supply system 22 is available, and can be connected to an input side of the intermediate circuit via an isolating contactor 24. On the other hand, a battery 21 is provided, and is connected via a battery contactor 23 to the input side of the intermediate circuit 34. The power supply system 22 is used on the one hand to directly supply the converter 31 with the direct current motor 32, and on the other hand for charging the battery 21. As already explained, the battery 21 provides the supply in the event of a power supply system failure, such that the direct current motor 32 can be operated via the converter 31, in order to move the rotor blades to a safe position. A voltage sensor 25 is arranged between the battery contactor 23 and the converter 31 on the intermediate circuit 34. Furthermore, a switchable fixed resistance 30 is optionally connected to the intermediate circuit 34, in parallel with the input of the converter 31. This allows the intermediate circuit 34, and therefore the battery 21, to be loaded. The contactors 23, 24 and the converter 31 are operated by the monitoring unit.

The monitoring unit 4 interacts with a load control module 5, a load identification module 6 and a test control module 7. The load control module 5 has a discharge control module 51, a monitoring module 52, a timer 53, a monitor module 54 and a detector 55. The test control module 7 has a memory 70, a modulation degree transmitter 71 and a measurement unit 72 for determining actual parameters of the direct current motor 32, a compensation unit 73, a brake test unit 74, a direction selection module 75 and an excitation switching module 76. The memory 70 contains a plurality of profiles for different loads. In the test mode, one of the profiles can be selected, and the converter 31 can be operated appropriately, such that the direct current motor 32, which has been braked such that it is stationary, produces the load according to the selected profile. In this case, the test control module 7 operates the excitation switching module 76, which is designed to disconnect the shunt winding 37 in the test mode. This means that the excitation in the test mode is produced solely by the series winding 36. The torque of the direct current motor 32 is therefore independent of the battery voltage, thus allowing a better response of the direct current motor 32 to be achieved in the test mode. In this case, the converter 31 acts like a transformer for direct current, in which case the transformation ratio can be varied by operating the converter 31 by means of the modulation degree transmitter 71. The intrinsically fixed resistance of the direct current motor 32 therefore represents a variable (load) resistance on the intermediate circuit 34, and therefore for the battery 21.

A test of the battery 21 is generally initiated by the operating control system 19. However, it is also possible for the monitoring unit 4 to autonomously initiate the test or to request the control system to carry out the test, for example via the timer 53. The test can thus be carried out at regular time intervals, for example weekly, depending on the load on the battery, for example after every tenth charging process, or in special situations, for example when the voltage returns after a power supply system failure, or in response to a manual demand by servicing personnel.

In a first step of the test, defined initial conditions are created. For this purpose, the load control module 5 operates the discharge control module 51 such that the intermediate circuit 34 is discharged via the fixed resistance 30 to a previously defined voltage level, in general the battery voltage level. The magnitude of the voltage is governed via the voltage sensor 25 and the battery monitor 40. This creates defined conditions for the test, which ensure reproducibility. The test control module 7 determines what type of test will be carried out.

For illustrative purposes, this will be explained using the simple case in which a defined load is produced by the fixed resistance 30. The fixed resistance 30 is operated for the test. A current then flows from the battery 21 into the intermediate circuit 34 and into the resistance 30. By means of the voltage sensor 25, the battery monitor 40 measures the battery voltage, and checks it for a voltage dip. If a previously definable voltage threshold is undershot in this case, then the battery monitor 40 identifies a fault. A corresponding fault signal is passed back from the monitoring unit 4 to the operating control system 19.

The load with a passive resistance can also be simulated by the converter 31 in conjunction with the motor 32, as a result of which there is no need for a separate fixed resistance 30. For this purpose, the profile for the fixed resistance is downloaded from the memory 70. The test control module 7 operates the converter 31 in accordance with this profile, such that the direct current motor 32 acts like a fixed resistance on the intermediate circuit 34, and therefore for the battery 21.

It is also possible to use the direct current motor 32 together with the "fixed resistance" profile together with the fixed resistance 30 as a load, in order to increase the battery load during the test. This makes it possible to achieve a very high load current without having to overload the components used for this purpose. In particular, this arrangement has a considerably greater thermal energy absorption capability than a fixed resistance. As described above, the test control module 7 operates the converter 31 such that it behaves like a fixed resistance. This results in a load of the same type, which can be evaluated easily in the manner already described by means of the voltage sensor 25 and the battery monitor 40.

In order to prevent undesirable rotation of the rotor blade 14 when current passes through the direct current motor 32, the brake 39 is operated by the load control module 5. This ensures that the pitch angle θ is unchanged. The pitch angle θ is in this case expediently monitored by means of sensors (which are not illustrated). If the blade pitch angle changes despite the brake 39 being operated, this is a signal that the brake 39 is defective. This is monitored by the brake test unit 74 which, in the event of a fault, transmits an appropriate fault signal to the monitoring unit 4, which passes this signal to the operating control system 19. The pitch-change torques which occur in this case may be considerable. Overall, the test represents a considerable load. In order to allow a reliable statement to be made about the state of the battery 21, the current drawn should be greater than a specific current for a specific time period. The values are not constant and depend on the respective operating state. To indicate the order of magnitude, a time period of at least about 7 seconds and at least 50 amperes may be quoted for a 2 MW wind energy installation; this would result in about 0.1 Ah being drawn. The temperature of both the switchable resistance 30 and that at the direct current motor 32 are expediently monitored by means of temperature sensors (which are not illustrated), in order to prevent overheating. A monitoring module 52 is provided for this purpose.

Furthermore, the monitoring module 55 is used to test whether the battery monitor 40 is serviceable. A load is applied or the battery is charged sufficiently that, when the load is applied, a voltage dip occurs to which the battery monitor responds. If, nevertheless, it does not respond, then it is probable that the battery monitor 40 is not operating correctly. If a fault is found, for example sticking of a switching contact, such that "good" is always indicated, then the test is ended.

The memory 70 may also contain other profiles. Profiles for loading with a constant current and loading with a constant power have likewise been proven. The latter offers the advantage that it at least approximates to the load on the battery 21 during actual operation when the rotor blades 14 are moved to the feathered position. In contrast, the profile for loading with a constant current offers the advantage that this allows better evaluation by the test control module 5. This will be explained in more detail in the following text.

For the test mode with a constant current, the battery current must be measured and must be kept constant by a closed-loop control system. To do this, the current flow must be determined. A current sensor 28 can be arranged on the intermediate circuit 34 for this purpose. In order to avoid the additional current sensor 28, the battery current can be determined from other existing variables, by means of a first estimator. This is done by making use of knowledge that the power balance must be compensated for via the battery 21 and the motor 32 in the test mode when the isolating contactor 24 to the power supply system 22 has been opened. The product of the battery voltage and current must therefore be equal to the product of the motor voltage and current. The current which is loading the battery is therefore inversely proportional to the respective voltages, that is to say $$I\text{batt}=I\text{motor}\times U\text{motor}/U\text{batt}.$$

The value of the battery voltage is available in any case in the monitoring unit 4, and the value for the motor voltage Umotor is determined by the converter 31, to be precise depending on the operation of its active switching elements. The measure for operation is the modulation degree M. Technically speaking, this is the output signal from a pulse-width modulator 35 which operates the converter 31. The modulation degree M is available in any case as a parameter for converter control. The determination of the battery current is therefore simplified to become:

$$I\text{batt}=I\text{motor}\times M.$$

It should be noted that, by definition, M and Imotor always have the same mathematical sign, thus resulting in a positive value for the battery current irrespective of the direction of the torque of the direct current motor 32. The rotation direction in the test mode is therefore intrinsically arbitrary. In order to keep the load for the brake 39 low, the direction selection module 75 determines the total torque acting on the brake 39 taking account of the other loads acting on the rotor blade 14, in particular the aerodynamic loads. It determines the rotation direction in which the brake 39 is more likely loaded (because the aerodynamic load counteracts the torque of the direct current motor 32), and selects this rotation direction.

The measurement unit 72 is designed to determine the effective resistance of the direct current motor 32 from the values for the motor voltage and current. It does this using the relationship:

$$R\text{motor}=U\text{motor}/I\text{motor}.$$

If sudden and/or serious changes occur, then this indicates a fault in the form of contact faults, a discontinuity, ground faults or shorts. Furthermore, heating of the direct current motor 32 can also be deduced from the resistance value and, if specific limits are overshot, it is possible together with the monitoring module to leave the test mode, and thus end the test. This therefore minimizes the risk of components being overloaded by the test. This allows the tests to be carried out not only when the wind energy installation is stationary, but also during operation, in any case on partial load.

Figure 5:
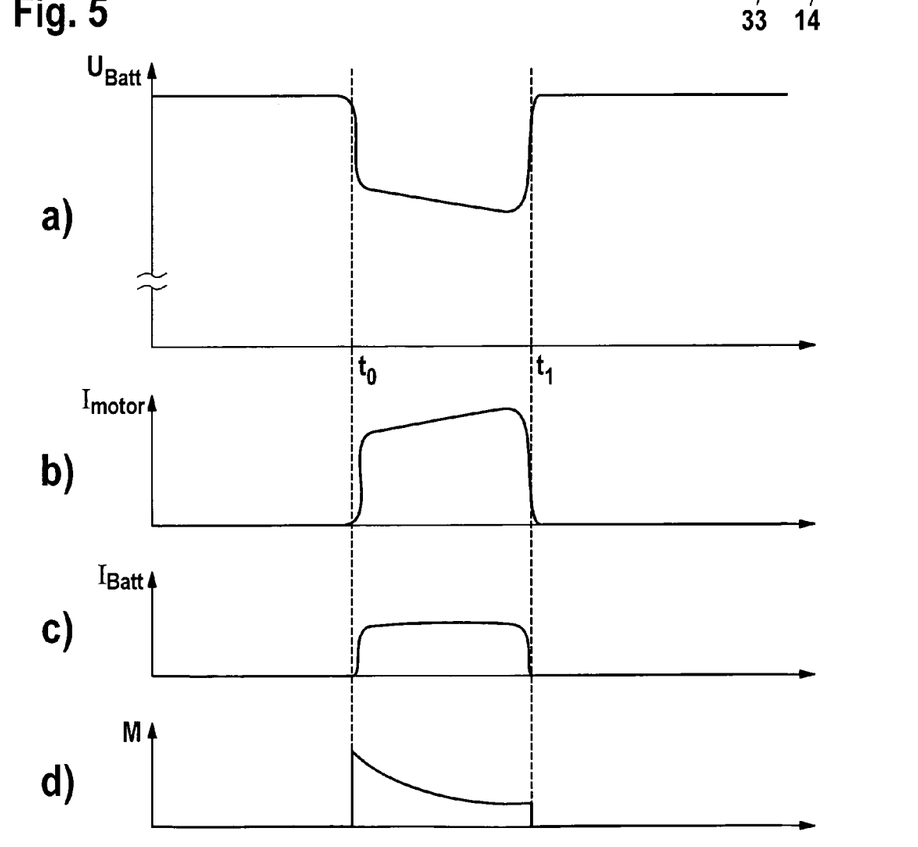
FIGS. 5a-d show graphs of the profile of voltages and currents.

The effect of the invention will be explained with reference to FIG. 5. The profile of the battery voltage is sketched in FIG. 5a). The test starts at the time t0, and a load is applied to the battery to be tested. As can be seen, the voltage first of all falls suddenly and subsequently on a quite flat profile, until the end of the test load at the time T1. The corresponding motor current Imotor is illustrated in FIG. 5b). As can be seen, the current becomes greater, the greater the extent to which the battery voltage dips. Because of the transformer effect of the converter 31, the current Ibatt from the battery 21 differs considerably. For example, the battery current as shown in FIG. 5c) does not have such a pronounced rise when the voltage decreases. This is because a change is made to compensate for the modulation degree M, as is illustrated in FIG. 5d).

The brake test unit 71 is deigned to check the brake 39. As described above, the direct current motor 32 is for this purpose operated as a load, and the torque produced by it is used as the test torque. The brake test unit 74 increases the torque to a value which is still less than or at most equal to the holding torque of the brake 39. It must then not slip. If this nevertheless occurs, a fault signal is generated and is output to the operating control system 19. The direction selection module 77 is used appropriately in order to keep the influence of the rotor blade 14 and of the loads acting on it low. It is also possible to carry out in each case one measurement per rotation direction in a rapid time sequence, and to carry out at least one qualitative good/bad assessment on this basis.

The parameters determined in the manner described above can be supplied to the compensation unit 73. This is designed to determine changes in the parameters, and to output appropriate compensation signals. For example, the motor resistance can be monitored and, if it increases, a correction signal to the modulation degree M can be output, so as to compensate for the reduction in the motor current resulting from the resistance increase. Differences resulting from scatters between different motors can also be identified and compensated for in a corresponding manner. The quality of the tests can be further improved in this way, leading to higher operational reliability of the wind energy installations.

A recording unit 8 is also provided. This is provided on the pitch controller 2. This is designed to receive and to store status signals and measured values from the test control module and the monitor module. It can also carry out an assessment and, if required, can transmit appropriate fault signals to a superordinate entity, such as the operating control system.

The invention claimed is:

1. A wind energy installation, comprising:
a rotor including at least one blade;
a generator configured to be driven by the rotor to produce electrical energy;
a pitch device configured to vary the at least one blade of the rotor, the pitch device including a power supply unit with a battery and an actuating drive; and
a monitoring unit including a load module configured to switch the actuating drive between an operating mode and a test mode, wherein, in the test mode, the actuating drive forms a preselectable defined load for the battery.

2. The wind energy installation of claim 1, wherein the actuating drive has a switchable resistance at its input, the resistance acting as a fixed load.

3. The wind energy installation of claim 1, wherein the actuating drive comprises a converter and a direct current motor, and the load control module is configured to apply a predeterminable current corresponding to the defined load to the direct current motor.

4. The wind energy installation of claim 3, further comprising a brake against whose operation the actuating drive is configured to act.

5. The wind energy installation of claim 1, further comprising a discharge control module configured to reduce the voltage acting on the actuating drive to a predetermined voltage level at the test start.

6. The wind energy installation of claim 1, further comprising a load identification module configured to determine a load state of the wind energy installation and inhibit the load control module if a threshold is exceeded.

7. The wind energy installation of claim 4, wherein the load control module is configured to monitor the at least one blade for a pitch change when the brake is operated and output a fault signal.

8. The wind energy installation of claim 1, further comprising a test control module configured to apply a selectable test characteristic to the actuating drive.

9. The wind energy installation of claim 1, further comprising a memory configured to store profiles for at least one of a passive resistance, a constant current, and a constant power.

10. The wind energy installation of claim 8, wherein the test control module includes a modulation degree transmitter configured to adjust the current output from the actuating drive so that a desired modulation degree is produced.

11. The wind energy installation of claim 8, wherein the test control module includes a measurement unit configured to detect actual parameters of the direct current motor and a compensation unit configured to compensate for changes in the parameters from a standard value.

12. The wind energy installation of claim 8, wherein the test control module is configured to interact with an excitation switching module, the excitation switching module being configured to pass current only through a series winding and disconnect a shunt winding.

13. The wind energy installation of claim 8, wherein the test control module includes a direction selection module configured to define a load direction of the at least one blade during operation of the wind energy installation and act on the test control module so that the actuating drive operates the at least one blade in the opposite direction.

14. The wind energy installation of claim 8, wherein the test control module includes a brake test unit configured to produce a specific test torque by means of the actuating drive.

15. The wind energy installation of claim 14, wherein the brake test unit is configured to carry out a bi-directional test by operating the direct current motor in both torque directions against the brake, and wherein a good/bad identification is carried out by means of a classifier.

16. The wind energy installation of claim 1, further comprising at least one of the following:
a discharge control module configured to reduce the voltage acting on the actuating drive to a predeterminable voltage level at the test start;
a battery monitor configured to monitor the voltage state of the battery;
a monitoring module configured to monitor a temperature of the resistance or of the direct current motor;
a timer in the load control module configured to carry out a test at predeterminable intervals and monitor timings during testing;

a load identification module configured to determine a load state of the wind energy installation and inhibit the load control module if a threshold is exceeded; and a monitor module configured to monitor the serviceability of the battery monitor.

17. A monitoring device for a pitch device for wind energy installations having a battery and an actuating drive, the monitoring device comprising:

a load control module configured to switch the actuating drive between an operating mode and a test mode, wherein, in the test mode, the actuating drive forms a preselectable defined load for the battery.

18. A method for monitoring a pitch device for wind energy installations, the pitch device having a battery and an actuating drive, the method comprising:

switching the actuating drive from an operating mode to a test mode;

using the actuating drive under a defined load for the battery during the test mode; and monitoring a voltage of the battery during the test mode.

* * * * *